United States Patent
Wiegand et al.

(10) Patent No.: US 10,411,068 B2
(45) Date of Patent: Sep. 10, 2019

(54) ELECTRICAL CONTACTS FOR MAGNETORESISTIVE RANDOM ACCESS MEMORY DEVICES

(71) Applicant: Intel Corporation, Santa Clara, CA (US)

(72) Inventors: Christopher J. Wiegand, Portland, OR (US); Oleg Golonzka, Beaverton, OR (US); Kaan Oguz, Beaverton, OR (US); Kevin P. O'Brien, Portland, OR (US); Tofizur Rahman, Portland, OR (US); Brian S. Doyle, Portland, OR (US); Tahir Ghani, Portland, OR (US); Mark L. Doczy, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/767,127

(22) PCT Filed: Nov. 23, 2015

(86) PCT No.: PCT/US2015/062078
§ 371 (c)(1),
(2) Date: Apr. 9, 2018

(87) PCT Pub. No.: WO2017/091189
PCT Pub. Date: Jun. 1, 2017

(65) Prior Publication Data
US 2019/0027536 A1    Jan. 24, 2019

(51) Int. Cl.
*H01L 43/12* (2006.01)
*H01L 27/22* (2006.01)
(Continued)

(52) U.S. Cl.
CPC ............ *H01L 27/228* (2013.01); *H01L 43/02* (2013.01); *H01L 43/08* (2013.01); *H01L 43/12* (2013.01)

(58) Field of Classification Search
CPC .............................. H01L 27/228; H01L 43/12
See application file for complete search history.

(56) References Cited

U.S. PATENT DOCUMENTS 6,288,449 B1 * 9/2001 Bhowmik ......... H01L 21/76843
257/762
2001/0007374 A1 7/2001 Liu et al.
(Continued)

FOREIGN PATENT DOCUMENTS

KR  1020150115360   10/2015
WO  2017091189 A1   6/2017

OTHER PUBLICATIONS

International Search Report and Written Opinion in International Patent Application No. PCT/US2015/062078, dated Aug. 8, 2016, 12 pages.

(Continued)

*Primary Examiner* — Thomas L Dickey
(74) *Attorney, Agent, or Firm* — Patent Capital Group

(57) ABSTRACT

Disclosed herein are electrical contacts for magnetoresistive random access memory (MRAM) devices and related memory structures, devices, and methods. For example, and electrical contact for an MRAM device may include: a tantalum region; a barrier region formed of a first material; and a passivation region formed of a second material and disposed between the tantalum region and the barrier region, wherein the second material includes tantalum nitride and is different from the first material.

25 Claims, 7 Drawing Sheets

(51) Int. Cl.
*H01L 43/02* (2006.01)
*H01L 43/08* (2006.01)

(56) References Cited

U.S. PATENT DOCUMENTS

| | | |
|---|---|---|
| 2003/0170985 A1 | 9/2003 | Hwang et al. |
| 2007/0108543 A1 | 5/2007 | Furuta et al. |
| 2007/0167010 A1 | 7/2007 | Furusawa et al. |
| 2007/0172964 A1 | 7/2007 | Yen et al. |
| 2010/0301480 A1 | 12/2010 | Choi et al. |
| 2014/0017818 A1 | 1/2014 | Ranjan et al. |
| 2014/0291663 A1* | 10/2014 | Kuo ..................... H01L 43/10 257/43 |

OTHER PUBLICATIONS

Extended European Search Report in European Patent Application No. 15909389.7 dated Jul. 22, 2019, 11 pages.

* cited by examiner

ELECTRICAL CONTACTS FOR MAGNETORESISTIVE RANDOM ACCESS MEMORY DEVICES

CROSS-REFERENCE TO RELATED APPLICATION

This application is a national stage application under 35 U.S.C. § 371 of PCT International Application Serial No. PCT/US2015/062078, filed on Nov. 23, 2015 and entitled "Electrical Contacts for Magnetoresistive Random Access Memory Devices," which is hereby incorporated by reference herein in its entirety.

TECHNICAL FIELD

The present disclosure relates generally to the field of integrated circuits, and more particularly, to electrical contacts for magnetoresistive random access memory devices.

BACKGROUND

Damascene processes are commonly used to form copper interconnects in integrated circuit (IC) devices. These processes may include forming a via opening down to a copper contact, then filling the via with additional copper. Some damascene processes may include performing a reactive hydrogen pre-clean on the copper contact after forming the via opening but before filling the via opening with additional copper, in order to reduce the surface oxide on the copper and improve the electrical connection between the copper contact and the additional copper.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
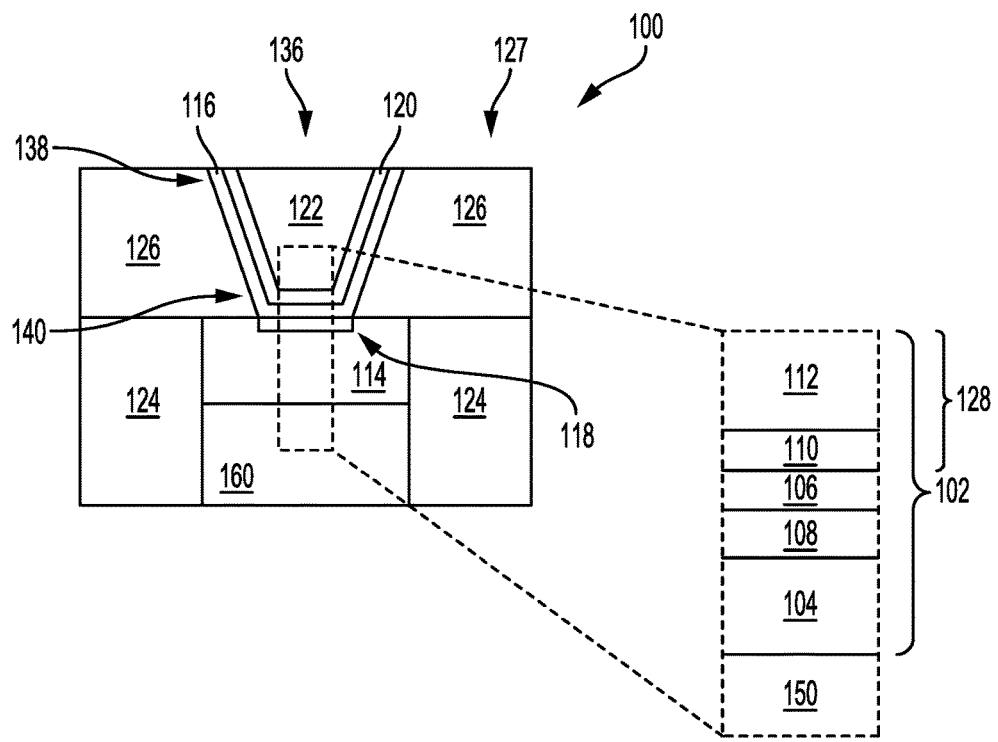
FIG. 1 is a cross-sectional side view of a memory structure, in accordance with various embodiments.

Disclosed herein are electrical contacts for magnetoresistive random access memory (MRAM) devices and related memory structures, devices, and methods. For example, an electrical contact for an MRAM device may include: a tantalum region; a barrier region formed of a first material; and a passivation region formed of a second material and disposed between the tantalum region and the barrier region, wherein the second material includes tantalum nitride and is different from the first material. A method of forming an electrical contact for an MRAM device, may include: forming an opening in a dielectric material to expose an area of a tantalum hardmask, wherein the tantalum hardmask is disposed between the via and the MRAM device; passivating the exposed area with nitrogen to form a passivation region including tantalum nitride; and providing a barrier layer on the passivation region and sidewalls of the opening. Other embodiments are discussed in detail herein.

Various ones of the embodiments disclosed herein may provide novel integrated circuit (IC) processing techniques, including MRAM contact clean and passivation in situ through via contact etch, that may improve the reliability and performance of memory devices. Many conventional IC fabrication facilities are tooled for standard copper damascene processes for forming copper interconnects. These processes include the performance of a reactive hydrogen pre-clean on exposed copper to remove any surface oxide that has developed before depositing additional material on the exposed copper.

However, the application of these standard damascene processes to MRAM devices may result in the unintended formation of performance-damaging features. For example, because MRAM devices are typically made of materials that aren't readily volatilized, tantalum hardmasks may be used during patterning and may remain in the IC device, serving as the top contact for the MRAM devices (instead of copper, as in a standard damascene process). When portions of the tantalum hardmask are exposed to air (e.g., when the device is being transported between tools), tantalum oxide will form on the exposed surfaces. Tantalum oxide is an electrical insulator, and typically forms in thicknesses that are too large for electrons to tunnel across. The presence of an electrical insulator in a pathway intended to be electrically conductive is a significant barrier to performance. Additionally, the reactive hydrogen pre-clean that removes surface oxide from copper does not remove tantalum oxide. Thus, when standard copper damascene processes are applied to MRAM devices having tantalum hardmasks, electrical contact with the MRAM devices is compromised by the presence of the electrically insulating tantalum oxide.

Other techniques to remove the tantalum oxide may suffer from other deficiencies. For example, a mechanical argon sputtering process may successfully remove the tantalum oxide prior to metallization, but is likely to also remove material other than the tantalum oxide (e.g., the dielectric material at the sidewalls of a via opening), thereby changing contact-critical dimensions of the IC device. For example, if narrowly spaced via openings are "widened," shorts between neighboring vias may occur. Additionally, a mechanical argon sputtering process may redistribute removed material to other locations around the IC device, which may interfere with further processing. For example, fragments of tantalum oxide may end up on the sidewalls of a via opening and may interfere with proper filling of the via.

As discussed in detail below, various ones of the embodiments disclosed herein may include the formation of a layer of tantalum nitride at an exposed surface of a tantalum hardmask of an IC device, prior to exposing the IC device to air. Unlike pure tantalum, tantalum nitride is not strongly reactive with air and does not readily oxidize (although a small amount of oxygen may be absorbed). Additionally, unlike tantalum oxide, tantalum nitride is conductive. Though not as conductive as pure tantalum, the presence of tantalum nitride in the conductive pathway to an MRAM device may not significantly impede electrical performance (in contrast to the presence of tantalum oxide). The electrical contacts, memory structures, devices, and methods disclosed herein may include these and/or other advantages, as discussed in detail below.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale.

FIG. 1 is a cross-sectional side view of a memory structure 100, in accordance with various embodiments. The memory structure 100 may include an electrical contact 102 for a magnetoresistive random access memory (MRAM) device 160. The memory structure 100 may include a tantalum hardmask 114 disposed on the MRAM device 160.

The tantalum hardmask 114 and the MRAM device 160 may be abutted by a first dielectric material 124. The first dielectric material 124 may be a low-k dielectric, such as a carbon-doped oxide (e.g., a dense carbon-doped oxide), silicon dioxide, silicon nitride, organic polymers such as perfluorocyclobutane or polytetrafluoroethylene, fluorosilicate glass, and organosilicates such as silsesquioxane, siloxane, or organosilicate glass. The first dielectric material 124 may include pores or air gaps to further reduce its dielectric constant. A second dielectric material 126 (which may take the form of any of the embodiments of the first dielectric material 124 discussed herein) may be disposed on the first dielectric material 124 and the tantalum hardmask 114. The first dielectric material 124 and the second dielectric material 126 may be a same dielectric material (although they may be deposited in different manufacturing steps); in other embodiments, the first dielectric material 124 and the second dielectric material 126 may be different dielectric materials. A via 136 may run through the second dielectric material 126 between a top surface 127 of the second dielectric material 126 and the tantalum hardmask 114. In some embodiments, as illustrated in FIG. 1, the via 136 may be tapered, with its wide end 138 proximate to the top surface 127 and its narrow end 140 proximate to the tantalum hardmask 114. In other embodiments, the via 136 may not be tapered.

The via 136 may include a barrier layer 116 disposed on the sidewalls and bottom of the via 136, a copper seed layer 120 disposed on the barrier layer 116, and copper fill 122 disposed on the copper seed layer 120. In some embodiments, the copper seed layer 120 and the copper fill 122 may be indistinguishable, and thus may be simply regarded as a copper portion.

The memory structure 100 may also include nitrogen-passivated tantalum 118. The nitrogen-passivated tantalum 118 may include tantalum nitride and may be disposed between the barrier layer 116 and tantalum of the tantalum hardmask 114. In particular, the nitrogen-passivated tantalum 118 may be disposed at the narrow end 140 of the via 136 and may be formed by passivating the tantalum hardmask 114 with a nitrogen compound after an opening for the via 136 is formed in the second dielectric material 126 (e.g., as discussed below with reference to FIGS. 4 and 5). Although the nitrogen-passivated tantalum 118 is shown in FIG. 1 as a rectangle, the nitrogen-passivated tantalum 118 may be formed by diffusion of nitrogen into the tantalum hardmask 114 (as discussed below), and thus the nitrogen-passivated tantalum 118 may have a diffusion profile consistent with that process. This diffusion may be isotropic, so the depth of the nitrogen-passivated tantalum 118 may be approximately equal to the lateral spread of the nitrogen-passivated tantalum 118. In some embodiments, the depth and lateral spread of the nitrogen-passivated tantalum 118 may be approximately 1-3 nanometers. Although the accompanying drawings illustrate the lateral spread of the nitrogen-passivated tantalum 118 as approximately equal to the width of the narrow end 140 of the via 136, the lateral spread of the nitrogen-passivated tantalum 118 may be wider than the width of the narrow end 140 of the via 136. As illustrated in FIG. 1, the nitrogen-passivated tantalum 118 may be disposed in the tantalum hardmask 114 such that the nitrogen-passivated tantalum 118 is disposed "vertically" between tantalum of the tantalum hardmask 114 and the copper fill 122, and "horizontally" between regions of tantalum of the tantalum hardmask 114.

As illustrated in the detailed section of FIG. 1, the electrical contact 102 may include a tantalum region 104 of the tantalum hardmask 114, a barrier region 106 of the barrier layer 116, and a passivation region 108 of the nitrogen-passivated tantalum 118. As discussed above, the passivation region 108 may include tantalum nitride formed by passivating the tantalum of the tantalum hardmask 114. In some embodiments, not all of the tantalum exposed to nitrogen during passivation may form tantalum nitride, and thus the passivation region 108 may include materials other than tantalum nitride. For example, the passivation region 108 may include pure tantalum, pure nitrogen, or oxynitride (formed, e.g., when pure nitrogen left behind after passivation is exposed to air and reacts with oxygen). The thickness of the passivation region 108 may be controlled by adjusting the time, temperature, and passivation technique used to form tantalum nitride from the tantalum in the tantalum hardmask 114. Examples of different passivation techniques are discussed below with reference to FIG. 5, and methods for adjusting the thickness of a passivated material are known in the art.

The barrier layer 116 may be formed of a material different from a material of the passivation region 108. In some embodiments, the barrier layer 116 may not include any tantalum. For example, the barrier layer 116 may include titanium (e.g., titanium nitride or titanium tungsten). In some embodiments, the composition of the material of the barrier layer 116 may be different from a composition of the material of the passivation region 108. In some embodiments, the barrier layer 116 may include tantalum (e.g., in its pure form, or as tantalum nitride). In embodiments in which tantalum nitride is included in the barrier layer 116, the presence of the nitrogen-passivated tantalum 118 may be indicated by a small amount of oxygen absorbed by the nitrogen-passivated tantalum 118 when it is exposed to air between processing operations, and thus the tantalum nitride of the barrier layer 116 and the nitrogen-passivated tantalum 118 may be distinguished.

The electrical contact 102 may also include a copper region 128. The copper region 128 may include a copper seed region 110 of the copper seed layer 120, and a copper fill region 112 of the copper fill 122. As discussed above with reference to the copper seed layer 120 and the copper fill 122, in some embodiments, the copper seed region 110 and the copper fill region 112 may be structurally indistinguishable, and thus may be simply regarded as the copper region 128.

Figure 2:
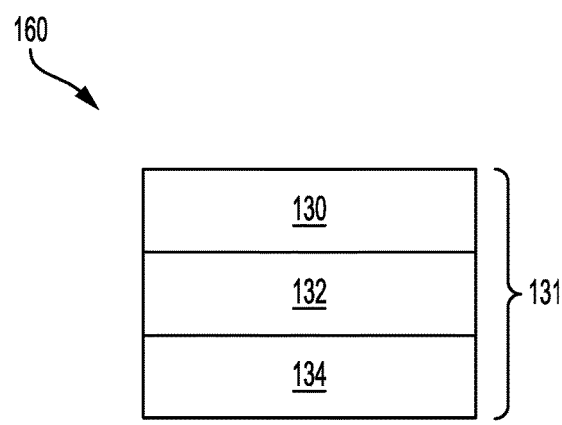
FIG. 2 is a cross-sectional side view of a magnetoresistive random access memory (MRAM) device, in accordance with various embodiments.

As shown in FIG. 1, the electrical contact 102 may be in contact with an MRAM device region 150 of the MRAM device 160. In particular, the tantalum region 104 may be disposed between the passivation region 108 and the MRAM device region 150. The MRAM device 160 may be any suitable type of memory (such as spin transfer torque MRAM (STT-M RAM)) and may have any desired architecture. For example, FIG. 2 is a cross-sectional side view of an embodiment of the MRAM device 160 including a magnetoresistive tunnel junction (MTJ) 131, in accordance with various embodiments. The MTJ 131 may include a top electrode 130, a bottom electrode 134, and a tunnel barrier material 132 disposed between the top electrode 130 and the bottom electrode 134. When the MRAM device 160 of FIG. 2 is included in the memory structure 100 of FIG. 1, the tantalum region 104 may be disposed on the top electrode 130 of the MTJ 131. As known in the art, MTJ devices operate on the principle of tunnel magnetoresistance between two magnetic layers separated by a tunnel junction. The MTJ 131 may have two stable states; when the magnetic moments of the two layers are aligned parallel to each other, the MTJ 131 exhibits a lower resistance, and when aligned antiparallel, the MTJ 131 exhibits a larger resistance. The MTJ 131 may be switched from any state to the other state by passing a suitable amount of current in the appropriate direction.

As noted above, the accompanying drawings are not necessarily drawn to scale, and appropriate dimensions are understood by those of skill in the art. For example, in some embodiments, the dimensions of the cross-sectional area of the tantalum hardmask 114 illustrated in FIG. 1 may be approximately 50 nm by 50 nm.

The memory structures 100 disclosed herein, and their components (e.g., electrical contacts 102), may be formed using any suitable technique. FIGS. 3-8 illustrate various stages in the formation of the memory structure 100, in accordance with various embodiments. Although particular structures are illustrated in FIGS. 3-8, and particular operations are discussed, these are simply for illustrative purposes, and any suitable structures and operations may be used in accordance with the teachings of the present disclosure.

Figure 3:
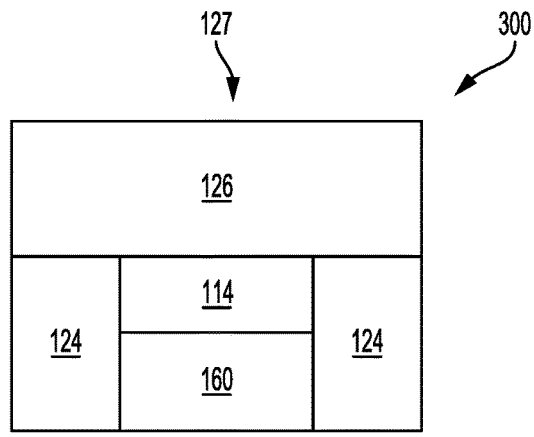
FIGS. 3-8 illustrate various stages in the formation of the memory structure of FIG. 1, in accordance with various embodiments.

FIG. 3 illustrates an assembly 300 including a tantalum hardmask 114 disposed between an MRAM device 160 and a layer of the second dielectric material 126. The MRAM device 160 may be disposed in a layer of the first dielectric material 124. The layer of second dielectric material 126 may have a top surface 127. The assembly 300 may be formed by any suitable procedure known in the art. For example, the assembly 300 may be formed by depositing and patterning the MRAM device 160 (e.g., depositing and patterning the MTJ 131 (FIG. 1)), depositing the first dielectric material 124, planarizing and exposing the MRAM device 160, and depositing the second dielectric material 126.

Figure 4:
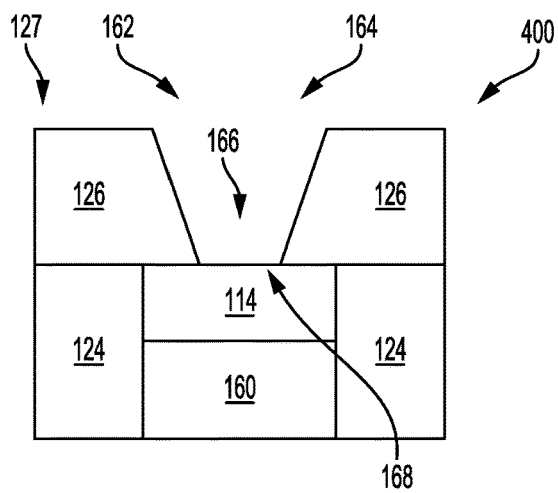

FIG. 4 illustrates an assembly 400 subsequent to forming an opening 162 in the assembly 300 from the top surface 127 to the tantalum hardmask 114, exposing an area 168 of the tantalum hardmask 114. The opening 162 may be formed by a dry etch process in which a plasma is used to remove the second dielectric material 126 while the assembly 400 is under vacuum. Because of the vacuum, little to no air will contact the area 168 of the tantalum hardmask 114 during the formation of the opening 162. In the embodiment illustrated in FIG. 4, the opening 162 may be tapered (e.g., because the dry etch is a directional dry etch) and may have a wide end 164 and a narrow end 166; the area 168 of the tantalum hardmask 114 may be proximate to the narrow end 166. As noted above, the opening 162 may not be tapered in other embodiments.

Figure 5:
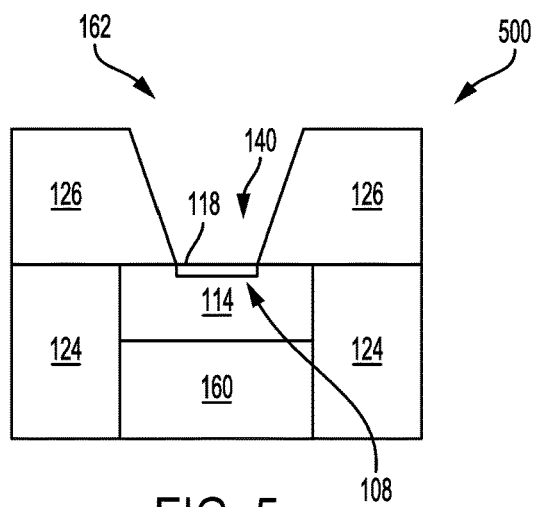

FIG. 5 illustrates an assembly 500 subsequent to passivating the area 168 of the assembly 400 to form an assembly 500 including nitrogen-passivated tantalum 118 at the area 168 in the tantalum hardmask 114. The nitrogen passivated tantalum 118 may include tantalum nitride (e.g., in the passivation region 108) and may take the form of any of the embodiments of the nitrogen-passivated tantalum 118 discussed above. The vacuum conditions around the assembly 400 may be maintained until the passivation begins, and thus the area 168 of the assembly 400 will not be wholly exposed to air. For example, the tool used to perform the dry etch discussed above with reference to FIG. 4 may also be used to provide nitrogen for passivation to the assembly 400 (e.g., by providing a nitrogenous material to the vacuum chamber).

Nitrogen passivation of the area 168 of the tantalum hardmask 114 may be performed in any of a number of ways. In some embodiments, passivating the area 168 may include performing a dry nitrogen gas exposure. In some embodiments, passivating the area 168 may include performing a nitrogen gas direct plasma exposure. In some embodiments, passivating the area 168 may include performing a nitrogen gas remote plasma exposure. A direct plasma exposure may involve direct contact between the plasma glow and the area to be passivated, while a remote plasma exposure may involve forming the plasma in a cavity that is separated from the area to be passivated, but connected by one or more gas channels to allow active species generated in the plasma to reach the area to be passivated. In some embodiments, passivating the area 168 may include performing an ammonia direct plasma exposure. In some embodiments, passivating the area 168 may include performing an ammonia remote plasma exposure. The choice of nitrogen containing gas gives one type of control of the types of active nitrogen species generated in the plasma space.

Figure 6:
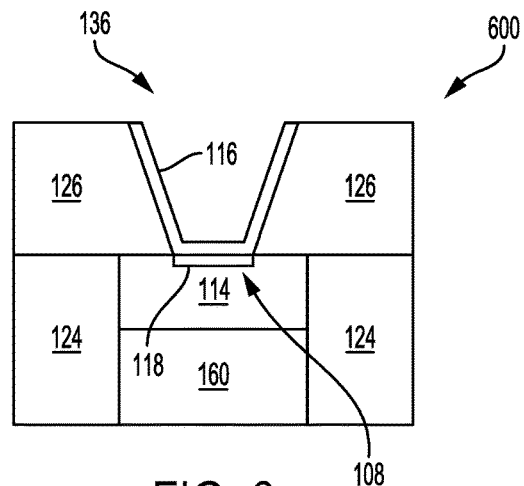

FIG. 6 illustrates an assembly 600 subsequent to providing a barrier layer 116 on the bottom and sidewalls of the opening 162 of the assembly 500. In some embodiments, the assembly 500 may be exposed to air after the nitrogen-passivated tantalum 118 is formed, and before the barrier layer 116 is provided. This air exposure may occur as the assembly 500 is moved between tools in a manufacturing facility. Because the tantalum nitride of the nitrogen-passivated tantalum 118 is stable to the oxygen in air, the tantalum nitride will not oxidize when exposed to air. Additionally, in some embodiments, the assembly 500 may be hydrogen gas plasma cleaned after the nitrogen-passivated tantalum 118 is formed, and before the barrier layer 116 is provided; the hydrogen gas plasma clean will not remove or react with the tantalum nitride. The barrier layer 116 may be provided using any suitable technique known in the art, such as plasma vapor deposition (PVD) (e.g., an ion metal plasma (IMP) process), chemical vapor deposition (CVD), or atomic layer deposition (ALD).

Figure 7:
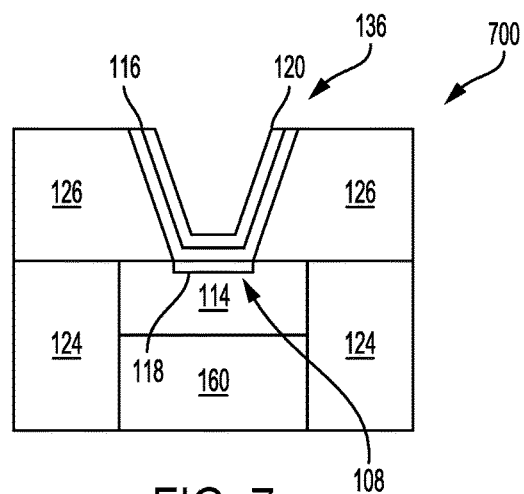

FIG. 7 illustrates an assembly 700 subsequent to providing a copper seed layer 120 on the barrier layer 116 in the opening 162 of the assembly 600. The copper seed layer 120 may be provided using any suitable technique known in the art, such as PVD, CVD, or ALD.

Figure 8:
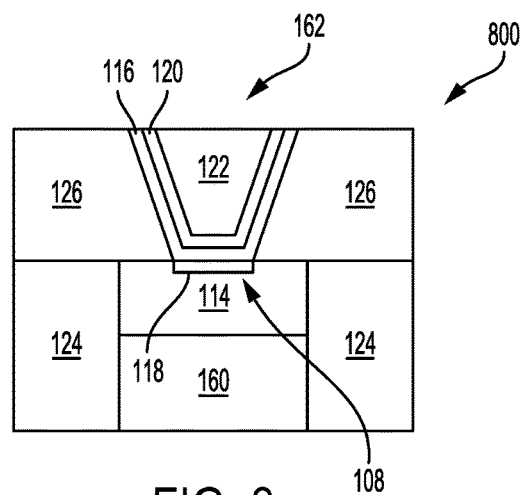

FIG. 8 illustrates assembly 800 subsequent to electroplating copper fill 122 into the opening 162, then removing any copper fill overburden (e.g., using chemical mechanical planarization (CMP)). Providing the copper seed layer 120 (FIG. 7) and electroplating the copper fill 122 (FIG. 8) may generally be part of a metallization process, and may be performed in accordance with any suitable metallization techniques. In particular, electroplating copper and then using CMP to remove overburden are known in the art of damascene processes. The assembly 800 may have the structure of the memory structure 100 discussed above with reference to FIG. 1.

Figure 9:
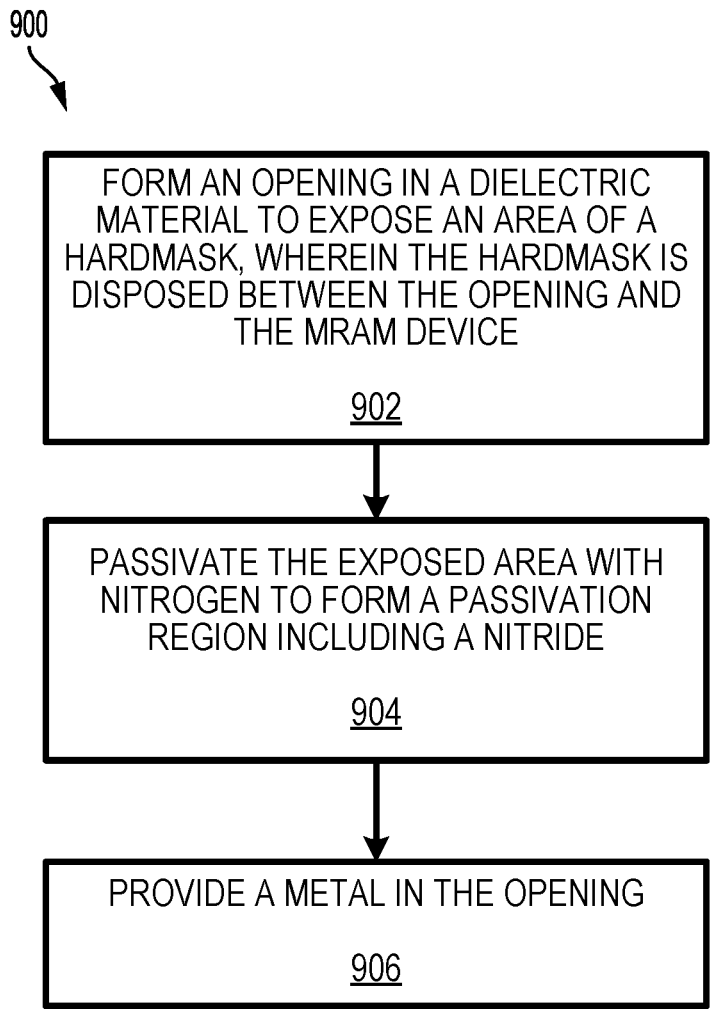
FIG. 9 is a flow diagram of a method of forming an electrical contact for an MRAM device, in accordance with various embodiments.

FIG. 9 is a flow diagram of a method 900 of forming an electrical contact for an MRAM device, in accordance with various embodiments. While the operations of the method 900 are arranged in a particular order in FIG. 9 and illustrated once each, in various embodiments, one or more of the operations may be repeated (e.g., when multiple electrical contacts for multiple MRAM devices are formed). Operations discussed below with reference to the method 900 may be illustrated with reference to the memory structure 100 of FIG. 1 and FIGS. 3-8, but this is simply for ease of discussion, and the method 900 may be used to form any appropriate electrical contact for any appropriate MRAM device.

At 902, an opening may be formed in a dielectric material to expose an area of a hardmask. The hardmask may be disposed between the opening and an MRAM device. For example, as illustrated in FIG. 4, an opening 162 may be formed in the second dielectric material 126 to expose an area 168 of the tantalum hardmask 114 (which is disposed between the opening 162 and the MRAM device 160).

At 904, the exposed area of the hardmask may be passivated with nitrogen to form a passivation region including a nitride. For example, as illustrated in FIG. 5, the area 168 of the tantalum hardmask 114 may be passivated with nitrogen to form the nitrogen-passivated tantalum 118 (including the passivation region 108), including tantalum nitride. The passivation of 904 may include any suitable passivation technique, such as those discussed above with reference to FIG. 5 (e.g., dry nitrogen gas exposure, nitrogen gas direct or remote plasma exposure, ammonia direct or remote plasma exposure, etc.).

At 906, a metal may be provided in the opening. For example, as illustrated in FIGS. 7 and 8, a copper seed layer 120 and a copper fill 122 may be provided in the opening.

In some embodiments, prior to providing the metal in the opening at 906, a barrier layer may be provided on the passivation region and sidewalls of the opening. For example, as illustrated in FIG. 6, a barrier layer 116 may be provided on the passivation region 108 and sidewalls of the opening 162. The method 900 may further include providing a copper seed layer on the barrier layer (e.g., the copper seed layer 120) and electroplating copper to fill the opening (e.g., the copper fill 122). As discussed above with reference to FIG. 6, in some embodiments, the passivation region formed at 904 may be exposed to air prior to providing the barrier layer at 906. In some embodiments, the passivation region and sidewalls of the opening may be plasma-cleaned prior to providing the barrier layer 906.

The electrical contacts and memory structures disclosed herein may be included in any suitable IC device, which may in turn be included in any suitable computing device. FIGS. 10-13 illustrate various examples of apparatuses that may include any of the electrical contacts and memory structures disclosed herein. Similarly, the methods disclosed herein may be used in any suitable stage in the manufacture of the apparatus as discussed below with reference to FIGS. 10-13.

Figures 10A, 10B:
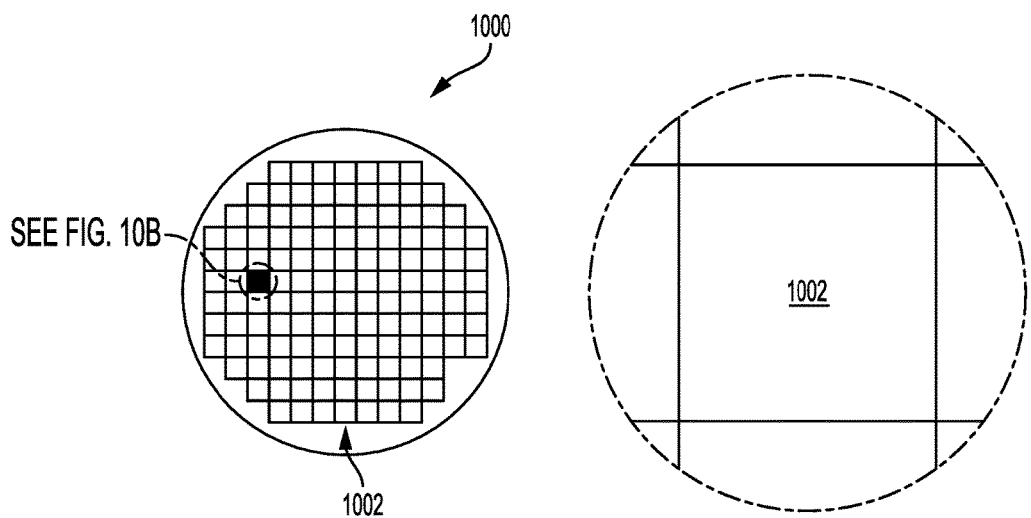
FIGS. 10A-B are top views of a wafer and dies that may include a memory structure in accordance with any of the embodiments disclosed herein.

FIGS. 10A-B are top views of a wafer 1000 and dies 1002 that may include the memory structure 100 (not shown) in accordance with any of the embodiments disclosed herein. The memory structure 100 may be one of multiple IC structures formed on the wafer 1000. The wafer 1000 may be composed of semiconductor material and may include one or more dies 1002 having IC structures formed on a surface of the wafer 1000. Each of the dies 1002 may be a repeating unit of a semiconductor product that includes one or more of the memory structures 100. After the fabrication of the semiconductor product is complete (e.g., including the operations discussed above with reference to FIGS. 3-9), the wafer 1000 may undergo a singulation process in which each of the dies 1002 is separated from one another to provide discrete "chips" of the semiconductor product. Thus, the memory structure 100 may be present in the wafer 1000 due to its presence in the dies 1002. In particular, the memory structure 100 may take the form of the wafer 1000 (e.g., not singulated) or the form of the die 1002 (e.g., singulated). In addition to the memory structure 100, that die 1002 may include one or more transistors (e.g., transistor(s) 1140 of FIG. 11, discussed below) and/or supporting circuitry to route electrical signals to the one or more transistors, as well as any other IC components.

In some embodiments, the memory structure 100 and logic devices may be combined on a single die 1002. For example, a memory array formed by multiple ones of the memory structures 100 (e.g., the memory array 1150 of FIG. 11, discussed below) may be formed on a same die 1002 as a processing device (e.g., the processing device 1302 of FIG. 13) or other logic that is configured to store information in the memory array or execute instructions stored in the memory array. For example, a processing device and a cache (using the memory array including multiple ones of the memory structures 100) may be formed on the same die.

Figure 11:
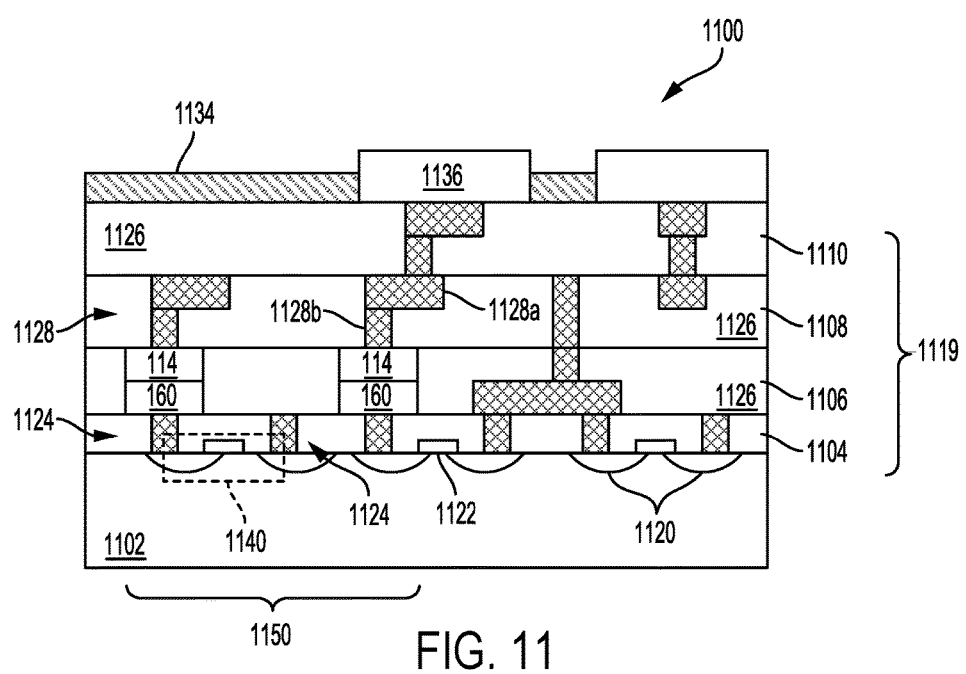
FIG. 11 is a cross-sectional side view of an IC device that may include a memory structure in accordance with any of the embodiments disclosed herein.

FIG. 11 is a cross-sectional side view of an IC device 1100 that may include a memory structure 100 in accordance with any of the embodiments disclosed herein. The IC device 1100 may be formed on a substrate 1102 (e.g., the wafer 1000 of FIG. 10A) and may be included in a die (e.g., the die 1002 of FIG. 10B). The substrate 1102 may be a semiconductor substrate composed of semiconductor material systems including, for example, N-type or P-type materials systems. The substrate 1102 may include, for example, a crystalline substrate formed using a bulk silicon or a silicon-on-insulator substructure. In some embodiments, the semiconductor substrate 1102 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV materials may also be used to form the substrate 1102. Although a few examples of materials from which the substrate 1102 may be formed are described here, any material that may serve as a foundation for an IC device 1100 may be used as suitable. The substrate 1102 may be part of a singulated die (e.g., the dies 1002 of FIG. 10B) or a wafer (e.g., the wafer 1000 of FIG. 10A).

The IC device 1100 may include one or more device layers 1104 disposed on the substrate 1102. The device layer 1104 may include features of one or more transistors 1140 (e.g., metal-oxide semiconductor field-effect transistors (MOSFETs)) formed on the substrate 1102. The device layer 1104 may include, for example, one or more source and/or drain (S/D) regions 1120, a gate 1122 to control current flow in transistors 1140 between the S/D regions 1120, and one or more S/D contacts 1124 to route electrical signals to/from the S/D regions 1120. The transistors 1140 may include additional features not depicted for the sake of clarity such as device isolation regions, gate contacts, and the like. The transistors 1140 are not limited to the type and configuration depicted in FIG. 11 and may include a wide variety of other types and configurations such as, for example, planar transistors, non-planar transistors, or a combination of both. Non-planar transistors may include FinFET transistors such as double-gate transistors or tri-gate transistors, and wrap-around or all-around gate transistors such as nanoribbon and nanowire transistors.

Each transistor 1140 may include a gate 1122 formed of at least two layers, a gate dielectric layer and a gate electrode layer. The gate dielectric layer may include one layer or a stack of layers. The one or more layers may include silicon oxide, silicon dioxide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer may be formed on the gate dielectric layer and may include at least one P-type work function metal or N-type work function metal, depending on whether the transistor 1140 is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, and conductive metal oxides—for example, ruthenium oxide. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide.

In some embodiments, when viewed as a cross-section of the transistor 1140 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1120 may be formed within the substrate 1102 adjacent to the gate 1122 of each transistor 1140. The S/D regions 1120 may be formed using either an implantation/diffusion process or an etching/deposition process. In the former process, dopants such as boron, aluminum, antimony, phosphorous, or arsenic may be ion-implanted into the substrate 1102 to form the S/D regions 1120. An annealing process that activates the dopants and causes them to diffuse further into the substrate 1102 may follow the ion implantation process. In the latter process, the substrate 1102 may first be etched to form recesses at the locations of the S/D regions 1120. An epitaxial deposition process may then be carried out to fill the recesses with material that is used to fabricate the S/D regions 1120. In some implementations, the S/D regions 1120 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1120 may be formed using one or more alternate semiconductor materials such as germanium or a group III-V material or alloy. In further embodiments, one or more layers of metal and/or metal alloys may be used to form the S/D regions 1120.

Electrical signals, such as power and/or input/output (I/O) signals, may be routed to and/or from the transistors 1140 of the device layer 1104 through one or more interconnect layers disposed on the device layer 1104 (illustrated in FIG. 11 as interconnect layers 1106-1110). For example, electrically conductive features of the device layer 1104 (e.g., the gate 1122 and the S/D contacts 1124) may be electrically coupled with interconnect structures 1128 of the interconnect layers 1106-1110. The one or more interconnect layers 1106-1110 may form an interlayer dielectric (ILD) stack 1119 of the IC device 1100.

The interconnect structures 1128 may be arranged within the interconnect layers 1106-1110 to route electrical signals according to a wide variety of designs (in particular, the arrangement is not limited to the particular configuration of interconnect structures 1128 depicted in FIG. 11). Although a particular number of interconnect layers 1106-1110 is depicted in FIG. 11, embodiments of the present disclosure include IC devices having more or fewer interconnect layers 1106-1110 than depicted.

In some embodiments, the interconnect structures 1128 may include trench structures 1128a (sometimes referred to as "lines") and/or via structures 1128b (sometimes referred to as "holes") filled with an electrically conductive material such as a metal. An example of a via structure 1128b is the via 136 discussed above. The trench structures 1128a may be arranged to route electrical signals in a direction of a plane that is substantially parallel with a surface of the substrate 1102 upon which the device layer 1104 is formed. For example, the trench structures 1128a may route electrical signals in a direction in and out of the page from the perspective of FIG. 11. The via structures 1128b may be arranged to route electrical signals in a direction of a plane that is substantially perpendicular to the surface of the substrate 1102 upon which the device layer 1104 is formed. In some embodiments, the via structures 1128b may electrically couple trench structures 1128a of different interconnect layers 1106-1110 together. In some embodiments, via structure 1128b (e.g., the via 136) may electrically couple a trench structure 1128a to a tantalum hardmask 114 serving as a top contact for an MRAM device 160 in a memory structure 100, as shown in FIG. 11.

The interconnect layers 1106-1110 may include a dielectric material 1126 disposed between the interconnect structures 1128, as shown in FIG. 11. The dielectric material 1126 may take the form of any of the embodiments of the first dielectric material 124 and the second dielectric material 126 discussed herein. In some embodiments, the dielectric material 1126 disposed between the interconnect structures 1128 in different ones of the interconnect layers 1106-1110 may have different compositions; in other embodiments, the composition of the dielectric material 1126 between different interconnect layers 1106-1110 may be the same.

A first interconnect layer 1106 (referred to as Metal 1 or "M1") may be formed directly on the device layer 1104. In some embodiments, the first interconnect layer 1106 may include trench structures 1128a and/or via structures 1128b, as shown. Trench structures 1128a of the first interconnect layer 1106 may be coupled with contacts (e.g., S/D contacts 1124) of the device layer 1104.

FIG. 11 also depicts two MRAM devices 160 disposed in the first interconnect layer 1106, with each coupled to S/D contacts 1124 of transistors 1140 in the device layer 1104. The transistors 1140 coupled to the MRAM devices 160 may drive current through the MRAM devices 160 during operation. The tantalum hardmask 114 is shown as disposed on the MRAM devices 160 as part of the memory structure 100 in accordance with any of the embodiments disclosed herein. When the MRAM device 160 and the tantalum hardmask 114 are included in the first interconnect layer 1106, the via 136 of the memory structure 100 may be included in the second interconnect layer 1108 (as shown). Multiple MRAM devices 160 included in multiple memory structures 100 may form a memory array 1150.

A second interconnect layer 1108 (referred to as Metal 2 or "M2") may be formed directly on the first interconnect layer 1106. In some embodiments, the second interconnect layer 1108 may include via structures 1128b to couple the trench structures 1128a of the second interconnect layer 1108 with the trench structures 1128a of the first interconnect layer 1106. Although the trench structures 1128a and the via structures 1128b are structurally delineated with a line within each interconnect layer (e.g., within the second interconnect layer 1108) for the sake of clarity, the trench structures 1128a and the via structures 1128b may be structurally and/or materially contiguous (e.g., simultaneously filled during a dual-damascene process) in some embodiments. In some embodiments, an MRAM device 160 and a tantalum hardmask 114 for the MRAM device 160 may be included in the second interconnect layer 1108, instead of or in addition to the first interconnect layer 1106 (as discussed above and illustrated in FIG. 11). In embodiments in which an MRAM device 160 and the tantalum hardmask 114 are included in the second interconnect layer 1108, the via 136 of the memory structure 100 may be included in the third interconnect layer 1110.

A third interconnect layer 1110 (referred to as Metal 3 or "M3") (and additional interconnect layers, as desired) may be formed in succession on the second interconnect layer 1108 according to similar techniques and configurations described in connection with the second interconnect layer 1108 on the first interconnect layer 1106. In some embodiments, an MRAM device 160 and a tantalum hardmask 114 for the MRAM device 160 may be included in the third interconnect layer 1110, instead of or in addition to the second interconnect layer 1108 or first interconnect layer 1106. In embodiments in which an MRAM device 160 and the tantalum hardmask 114 are included in the third interconnect layer 1110, the via 136 of the memory structure 100 may be included in a fourth interconnect layer (not shown). Generally, the MRAM device 160 and the associated tantalum hardmask 114 may be included in any desired interconnect layer, with the associated via 136 disposed in the above and adjacent interconnect layer.

The IC device 1100 may include a solder resist material 1134 (e.g., polyimide or similar material) and one or more bond pads 1136 formed on the interconnect layers 1106-1110. The bond pads 1136 may be electrically coupled with the interconnect structures 1128 and configured to route the electrical signals of transistor(s) 1140 (and the MRAM devices 160) to other external devices. For example, solder bonds may be formed on the one or more bond pads 1136 to mechanically and/or electrically couple a chip including the IC device 1100 with another component (e.g., a circuit board). The IC device 1100 may have other alternative configurations to route the electrical signals from the interconnect layers 1106-1110 than depicted in other embodiments. For example, the bond pads 1136 may be replaced by or may further include other analogous features (e.g., posts) that route the electrical signals to external components.

Figure 12:
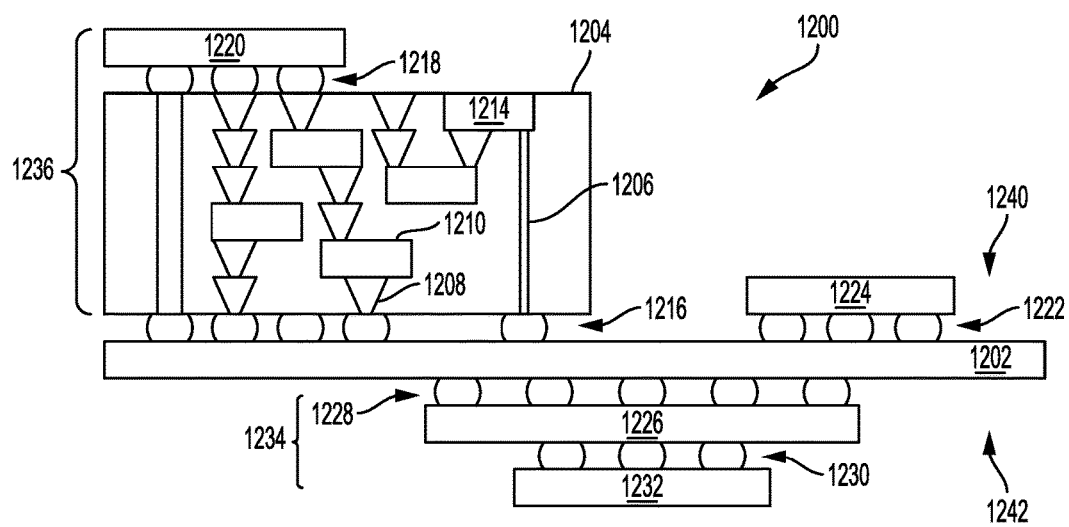
FIG. 12 is a cross-sectional side view of an IC device assembly that may include a memory structure in accordance with any of the embodiments disclosed herein.

FIG. 12 is a cross-sectional side view of an IC device assembly 1200 that may include a memory structure 100 in accordance with any of the embodiments disclosed herein. The IC device assembly 1200 includes a number of components disposed on a circuit board 1202 (which may be, for example, a motherboard). The IC device assembly 1200 includes components disposed on a first face 1240 of the circuit board 1202 and an opposing second face 1242 of the circuit board 1202; generally, components may be disposed on one or both faces 1240 and 1242.

In some embodiments, the circuit board 1202 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1202. In other embodiments, the circuit board 1202 may be a non-PCB substrate.

The IC device assembly 1200 illustrated in FIG. 12 includes a package-on-interposer structure 1236 coupled to the first face 1240 of the circuit board 1202 by coupling components 1216. The coupling components 1216 may electrically and mechanically couple the package-on-interposer structure 1236 to the circuit board 1202, and may include solder balls (as shown in FIG. 12), male and female portions of a socket, an adhesive, an underfill material, and/or any other suitable electrical and/or mechanical coupling structure.

The package-on-interposer structure 1236 may include an IC package 1220 coupled to an interposer 1204 by coupling components 1218. The coupling components 1218 may take any suitable form for the application, such as the forms discussed above with reference to the coupling components 1216. Although a single IC package 1220 is shown in FIG. 12, multiple IC packages may be coupled to the interposer 1204; indeed, additional interposers may be coupled to the interposer 1204. The interposer 1204 may provide an intervening substrate used to bridge the circuit board 1202 and the IC package 1220. The IC package 1220 may be or include, for example, a die (the die 1002 of FIG. 10B), an IC device (e.g., the IC device 1100 of FIG. 11), a memory module (including one or more of the memory structures 100, e.g., in a memory array 1150, which may be included in the IC device 1100 of FIG. 11 and/or the die 1002 of FIG. 10B), or any other suitable component. Generally, the interposer 1204 may spread a connection to a wider pitch or to reroute a connection to a different connection. For example, the interposer 1204 may couple the IC package 1220 (e.g., a die) to a ball grid array (BGA) of the coupling components 1216 for coupling to the circuit board 1202. In the embodiment illustrated in FIG. 12, the IC package 1220 and the circuit board 1202 are attached to opposing sides of the interposer 1204; in other embodiments, the IC package 1220 and the circuit board 1202 may be attached to a same side of the interposer 1204. In some embodiments, three or more components may be interconnected by way of the interposer 1204.

The interposer 1204 may be formed of an epoxy resin, a fiberglass-reinforced epoxy resin, a ceramic material, or a polymer material such as polyimide. In some implementations, the interposer 1204 may be formed of alternate rigid or flexible materials that may include the same materials described above for use in a semiconductor substrate, such as silicon, germanium, and other group III-V and group IV materials. The interposer 1204 may include metal interconnects 1208 and vias 1210, including but not limited to through-silicon vias (TSVs) 1206. The interposer 1204 may further include embedded devices 1214, including both passive and active devices. Such devices may include, but are not limited to, capacitors, decoupling capacitors, resistors, inductors, fuses, diodes, transformers, sensors, electrostatic discharge (ESD) devices, and memory devices (e.g., including the memory structure 100). More complex devices such as radio-frequency (RF) devices, power amplifiers, power management devices, antennas, arrays, sensors, and microelectromechanical systems (MEMS) devices may also be formed on the interposer 1204. The package-on-interposer structure 1236 may take the form of any of the package-on-interposer structures known in the art.

The IC assembly 1200 may include an IC package 1224 coupled to the first face 1240 of the circuit board 1202 by coupling components 1222. The coupling components 1222 may take the form of any of the embodiments discussed above with reference to the coupling components 1216, and the IC package 1224 may take the form of any of the embodiments discussed above with reference to the IC package 1220.

The IC device assembly 1200 illustrated in FIG. 12 includes a package-on-package structure 1234 coupled to the second face 1242 of the circuit board 1202 by coupling components 1228. The package-on-package structure 1234 may include an IC package 1226 and an IC package 1232 coupled together by coupling components 1230 such that the IC package 1226 is disposed between the circuit board 1202 and the IC package 1232. The coupling components 1228 and 1230 may take the form of any of the embodiments of the coupling components 1216 discussed above, and the IC packages 1226 and 1232 may take the form of any of the embodiments of the IC package 1220 discussed above. The package-on-package structure 1234 may be configured in accordance with any of the package-on-package structures known in the art.

Figure 13:
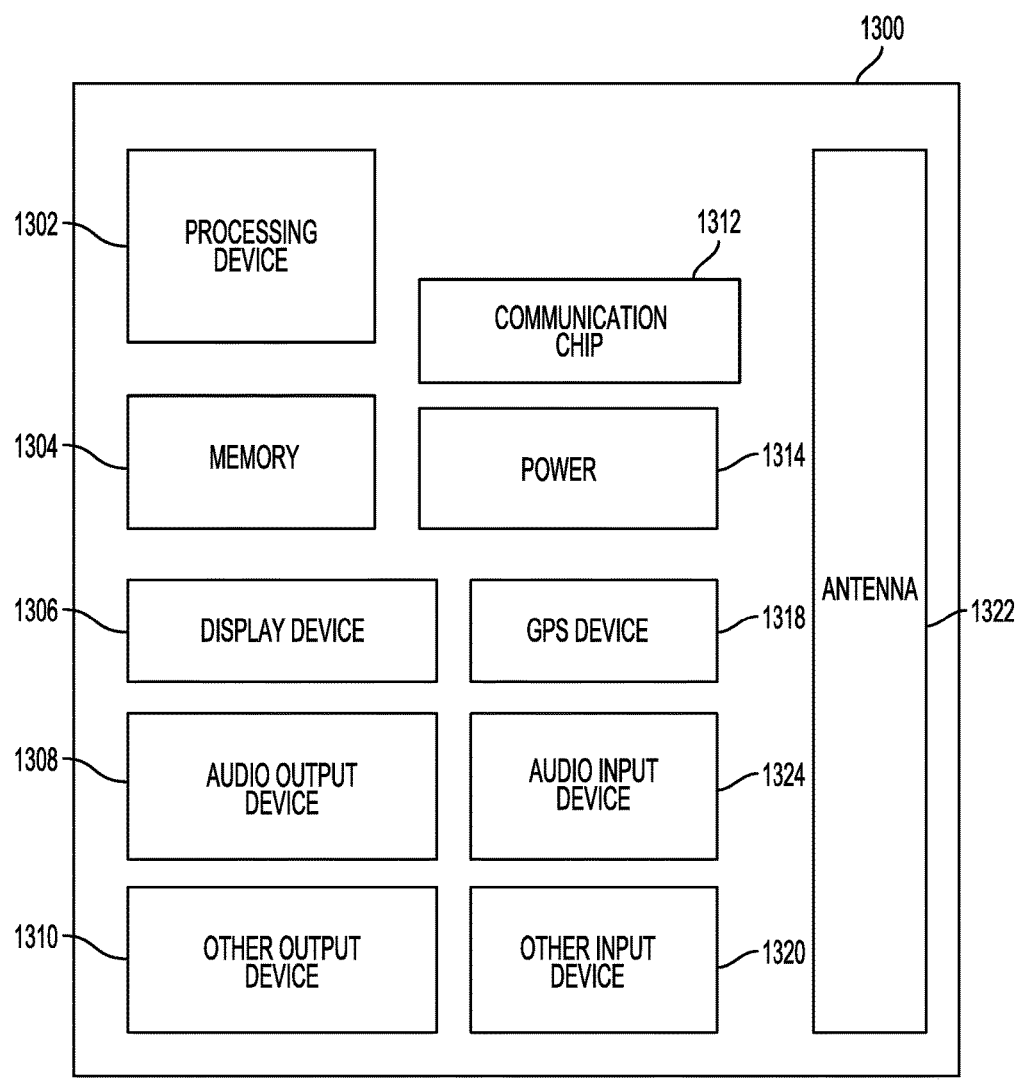
FIG. 13 is a block diagram of an example computing device that may include a memory structure in accordance with the teachings of the present disclosure.

FIG. 13 is a block diagram of an example computing device 1300 that may include a memory structure 100 in accordance with the teachings of the present disclosure. In particular, any of the components of the computing device 1300 that may store data may include the memory structure 100 (e.g., in the form of a memory array 1150 (FIG. 11), in an IC device 1100 (FIG. 11), and/or in a die 1002 (FIG. 10B)). A number of components are illustrated in FIG. 13 as included in the computing device 1300, but any one or more of these components may be omitted or duplicated, as suitable for the application. In some embodiments, some or all of the components included in the computing device 1300 may be attached to one or more motherboards. In some embodiments, some or all of these components are fabricated onto a single system-on-a-chip (SoC) die.

Additionally, in various embodiments, the computing device 1300 may not include one or more of the components illustrated in FIG. 13, but the computing device 1300 may include interface circuitry for coupling to the one or more components. For example, the computing device 1300 may not include a display device 1306, but may include display device interface circuitry (e.g., a connector and driver circuitry) to which a display device 1306 may be coupled. In another set of examples, the computing device 1300 may not include an audio input device 1324 or an audio output device 1308, but may include audio input or output device interface circuitry (e.g., connectors and supporting circuitry) to which an audio input device 1324 or audio output device 1308 may be coupled. Any one or more of the components of the computing device 1300 may be included in one or more IC devices that may include an embodiment of the memory structure 100 disclosed herein.

The computing device 1300 may include a processing device 1302 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1302 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 1300 may include a memory 1304, which may itself include one or more memory devices such as volatile memory (e.g., dynamic random access memory (DRAM)), non-volatile memory (e.g., read-only memory (ROM)), flash memory, solid state memory, and/or a hard drive. In some embodiments, the memory 1304 may include memory that shares a die with the processing device 1302. This memory may be used as cache memory and may include embedded DRAM (eDRAM) or STT-MRAM. The processing device 1302 and/or the memory 1304 may include one or more of the memory structures 100 (e.g., in STT-MRAM).

In some embodiments, the computing device 1300 may include a communication chip 1312 (e.g., one or more communication chips). For example, the communication chip 1312 may be configured for managing wireless communications for the transfer of data to and from the computing device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not.

The communication chip 1312 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1312 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1312 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1312 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1312 may operate in accordance with other wireless protocols in other embodiments. The computing device 1300 may include an antenna 1322 to facilitate wireless communications and/or to receive other wireless communications (such as AM or FM radio transmissions).

In some embodiments, the communication chip 1312 may manage wired communications, such as electrical, optical, or any other suitable communication protocols (e.g., the Ethernet). As noted above, the communication chip 1312 may include multiple communication chips. For instance, a first communication chip 1312 may be dedicated to shorter-range wireless communications such as Wi-Fi or Bluetooth, and a second communication chip 1312 may be dedicated to longer-range wireless communications such as GPS, EDGE, GPRS, CDMA, WiMAX, LTE, EV-DO, or others. In some embodiments, a first communication chip 1312 may be dedicated to wireless communications, and a second communication chip 1312 may be dedicated to wired communications. The communication chip 1312 may include one or more of the memory structures 100.

The computing device 1300 may include battery/power circuitry 1314. The battery/power circuitry 1314 may include one or more energy storage devices (e.g., batteries or capacitors) and/or circuitry for coupling components of the computing device 1300 to an energy source separate from the computing device 1300 (e.g., AC line power).

The computing device 1300 may include a display device 1306 (or corresponding interface circuitry, as discussed above). The display device 1306 may include any visual indicators, such as a heads-up display, a computer monitor, a projector, a touchscreen display, a liquid crystal display (LCD), a light-emitting diode display, or a flat panel display, for example.

The computing device 1300 may include an audio output device 1308 (or corresponding interface circuitry, as discussed above). The audio output device 1308 may include any device that generates an audible indicator, such as speakers, headsets, or earbuds, for example.

The computing device 1300 may include an audio input device 1324 (or corresponding interface circuitry, as discussed above). The audio input device 1324 may include any device that generates a signal representative of a sound, such as microphones, microphone arrays, or digital instruments (e.g., instruments having a musical instrument digital interface (MIDI) output).

The computing device 1300 may include a global positioning system (GPS) device 1318 (or corresponding interface circuitry, as discussed above). The GPS device 1318 may be in communication with a satellite-based system and may receive a location of the computing device 1300, as known in the art.

The computing device 1300 may include an other output device 1310 (or corresponding interface circuitry, as discussed above). Examples of the other output device 1310 may include an audio codec, a video codec, a printer, a wired or wireless transmitter for providing information to other devices, or an additional storage device.

The computing device 1300 may include an other input device 1320 (or corresponding interface circuitry, as discussed above). Examples of the other input device 1320 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1300 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 1300 may be any other electronic device that processes data.

The following paragraphs provide various examples of the embodiments disclosed herein.

Example 1 is an electrical contact for a magnetoresistive random access memory (MRAM) device, including: a tantalum region; a barrier region formed of a first material; and a passivation region formed of a second material and disposed between the tantalum region and the barrier region; wherein the second material includes tantalum nitride and is different from the first material.

Example 2 may include the subject matter of Example 1, and may further include a copper region, wherein the barrier region is disposed between the passivation region and the copper region.

Example 3 may include the subject matter of Example 2, and may further specify that the copper region includes a copper seed region.

Example 4 may include the subject matter of any of Examples 1-3, and may further specify that the first material includes titanium.

Example 5 may include the subject matter of Example 4, and may further specify that the first material includes titanium nitride.

Example 6 may include the subject matter of any of Examples 1-5, and may further specify that the tantalum region is disposed between the passivation region and the MRAM device.

Example 7 may include the subject matter of any of Examples 1-6, and may further specify that the MRAM device includes a magnetoresistive tunnel junction (MTJ), the MTJ includes a pair of electrodes having a tunnel barrier material therebetween, and the tantalum region is disposed on an electrode of the pair of electrodes.

Example 8 may include the subject matter of any of Examples 1-7, and may further specify that the tantalum region is part of a tantalum hardmask.

Example 9 may include the subject matter of any of Examples 1-8, and may further specify that the barrier region is disposed in a tapered via, the tapered via has a narrow end and a wide end, and the passivation region is disposed at the narrow end of the tapered via.

Example 10 may include the subject matter of any of Examples 1-9, and may further specify that the second material also includes oxynitride.

Example 11 is a method of forming an electrical contact for a magnetoresistive random access memory (MRAM) device, including: forming an opening in a dielectric material to expose an area of a hardmask, wherein the hardmask is disposed between the opening and the MRAM device; passivating the exposed area with nitrogen to form a passivation region including a nitride; and providing a metal in the opening.

Example 12 may include the subject matter of Example 11, and may further include: providing a barrier layer on the passivation region and sidewalls of the opening; wherein providing the metal in the opening includes providing a copper seed layer on the barrier layer, and after providing the copper seed layer, electroplating copper to fill the opening.

Example 13 may include the subject matter of any of Examples 11-12, and may further include, after passivating the exposed area, and before providing the metal, exposing the passivation region to air.

Example 14 may include the subject matter of Example 13, and may further include, after exposing the passivation region to air, and before providing the metal, plasma-cleaning the passivation region and the sidewalls of the opening.

Example 15 may include the subject matter of any of Examples 11-14, and may further specify that passivating the exposed area includes performing a dry nitrogen gas exposure.

Example 16 may include the subject matter of any of Examples 11-15, and may further specify that passivating the exposed area includes performing a nitrogen gas direct or remote plasma exposure.

Example 17 may include the subject matter of any of Examples 11-16, and may further specify that passivating the exposed area includes performing an ammonia direct or remote plasma exposure.

Example 18 is a memory structure, including: a magnetoresistive random access memory (MRAM) device; and an electrical contact for electrical communication with the MRAM device, wherein the electrical contact includes a tantalum region, a barrier region formed of a first material, wherein the first material includes titanium, a passivation region formed of a second material and disposed between the tantalum region and the barrier region, wherein the second material includes tantalum nitride and is different from the first material, and a copper region, wherein the barrier region is disposed between the copper region and the passivation region.

Example 19 may include the subject matter of Example 18, and may further include a metal layer disposed between the MRAM device and a transistor.

Example 20 may include the subject matter of Example 19, and may further specify that the transistor drives current through the metal layer and the MRAM device.

Example 21 may include the subject matter of any of Examples 18-20, and may further specify that the MRAM device is disposed between two metal layers.

Example 22 may include the subject matter of Example 21, and may further specify that the copper region is included in one of the two metal layers.

Example 23 may include the subject matter of any of Examples 18-22, and may further specify that the tantalum region is included in a tantalum hardmask.

Example 24 may include the subject matter of any of Examples 18-23, and may further specify that the second material also includes oxynitride.

Example 25 may include the subject matter of any of Examples-24 18, and may further specify that the MRAM device includes a magnetoresistive tunnel junction (MTJ).

Example 26 is a computing device, including: a processing device; and a memory array, including multiple magnetoresistive random access memory (MRAM) devices and multiple corresponding electrical contacts for electrical communication with the MRAM devices, wherein an electrical contact includes a tantalum region, a barrier region formed of a first material, a passivation region formed of a second material and disposed between the tantalum region and the barrier region, wherein the second material includes tantalum nitride and is different from the first material.

Example 27 may include the subject matter of Example 26, and may further include: an antenna; a communication chip; a display; and a battery.

Example 28 may include the subject matter of any of Examples-26-27, and may further include a graphics processing unit, a power amplifier, a global positioning system receiver, or a voltage regulator.

Example 29 may include the subject matter of any of Examples 26-28, and may further specify that the electrical contact further includes a copper region, and the barrier region is disposed between the passivation region and the copper region.

Example 30 may include the subject matter of Example 29, and may further specify that the copper region includes a copper seed region.

Example 31 may include the subject matter of any of Examples 26-30, and may further specify that the first material includes titanium.

Example 32 may include the subject matter of Example 31, and may further specify that the first material includes titanium nitride.

Example 33 may include the subject matter of any of Examples 26-32, and may further specify that the tantalum region is disposed between the passivation region and the MRAM device.

Example 34 may include the subject matter of any of Examples 26-33, and may further specify that the tantalum region is part of a tantalum hardmask.

Example 35 may include the subject matter of any of Examples 26-34, and may further specify that the barrier region is disposed in a tapered via, the tapered via has a narrow end and a wide end, and the passivation region is disposed at the narrow end of the tapered via.

Example 36 may include the subject matter of any of Examples 26-35, and may further specify that the second material also includes oxynitride.

Example 37 may include the subject matter of any of Examples 26-36, and may further specify that the MRAM device includes a magnetoresistive tunnel junction (MTJ).

Example 38 may include the subject matter of any of Examples 26-37, and may further specify that the MRAM device is a spin transfer torque MRAM (STT-MRAM) device.

Example 39 is an electrical contact for a magnetoresistive random access memory (MRAM) device, including: an MRAM top contact formed of a first material; a metal contact; and a passivation region formed of a nitride of the first material and embedded in the MRAM top contact, wherein the passivation region is disposed between the MRAM top contact and the metal contact.

Example 40 may include the subject matter of Example 39, and may further specify that the MRAM top contact is part of a hardmask.

Example 41 may include the subject matter of Example 40, and may further specify that the hardmask includes tantalum.

Example 42 may include the subject matter of any of Examples 39-42, and may further specify that the metal contact includes copper.

Example 43 may include the subject matter of any of Examples 39-41, and may further specify that the passivation region includes oxynitride.

Example 44 is an electrical contact for a magnetoresistive random access memory (MRAM) device, including: a hardmask, wherein the hardmask includes first, second, and third regions in a cross section of the electrical contact; a metal region; and a passivation region formed of a first material and disposed between the first region of the hardmask and the metal region in a first direction; wherein the passivation region is disposed between the second and third regions of the hardmask in a second direction in the cross section of the electrical contact, and wherein the second direction is perpendicular to the first direction.

Example 45 may include the subject matter of Example 44, and may further specify that the passivation region includes tantalum nitride.

Example 46 may include the subject matter of any of Examples 44-45, and may further specify that the metal region includes copper.

Example 47 may include the subject matter of any of Examples 44-46, and may further specify that the first region of the hardmask is disposed between the passivation region and the MRAM device.

Example 48 may include the subject matter of any of Examples 44-47, and may further specify that the first material includes oxynitride.

The invention claimed is:

1. An electrical contact of a memory structure, comprising:
a first material;
a metal contact; and
a second material including a nitride of the first material and embedded in the first material, wherein the second material is between the first material and the metal contact, and the second material includes an oxynitride.

2. The electrical contact of claim 1, wherein the first material is part of a hardmask.

3. The electrical contact of claim 2, wherein the hardmask includes tantalum.

4. The electrical contact of claim 1, wherein the metal contact includes copper.

5. An electrical contact of a memory structure, comprising:
a tantalum region;
a first material; and
a second material between the tantalum region and the first material;
wherein the second material includes tantalum nitride and is different from the first material, the first material is in a tapered via, the tapered via has a narrow end and a wide end, and the second material is at the narrow end of the tapered via.

6. The electrical contact of claim 5, wherein the first material includes titanium.

7. The electrical contact of claim 6, wherein the first material includes titanium and nitrogen.

8. The electrical contact of claim 5, wherein the tantalum region is between the second material and a magnetoresistive random access memory (MRAM) device of the memory structure.

9. The electrical contact of claim 5, wherein the memory structure includes a magnetoresistive tunnel junction (MTJ), the MTJ includes a pair of electrodes having a tunnel barrier material therebetween, and the tantalum region is on an electrode of the pair of electrodes.

10. The electrical contact of claim 5, wherein the tantalum region is part of a tantalum hardmask.

11. The electrical contact of claim 5, wherein the second material includes an oxynitride.

12. A memory structure, comprising:
a magnetoresistive random access memory (M RAM) device; and
an electrical contact for electrical communication with the MRAM device, wherein the electrical contact includes:
a tantalum region,
a first material including titanium,
a second material between the tantalum region and the first material, wherein the second material includes tantalum and nitrogen and is different from the first material, and
a copper region, wherein the first material is between the copper region and the second material, the MRAM device is between two metal layers, and the copper region is included in one of the two metal layers.

13. The memory structure of claim 12, further comprising:
a metal layer between the MRAM device and a transistor.

14. The memory structure of claim 13, wherein the transistor is to drive current through the metal layer and the MRAM device.

15. The memory structure of claim 12, wherein the tantalum region is included in a tantalum hardmask.

16. The memory structure of claim 12, wherein the MRAM device includes a magnetoresistive tunnel junction (MTJ).

17. The memory structure of claim 12, wherein the memory structure is included in a computing device.

18. An integrated circuit (IC) structure, comprising:
a magnetoresistive random access memory (MRAM) device; and
an electrical contact for electrical communication with the MRAM device, wherein the electrical contact includes:
a first material,
a metal contact, and
a second material including a nitride of the first material, wherein the second material is between the first material and the metal contact;
wherein the first material is between the second material and the MRAM device.

19. The IC structure of claim 18, wherein the MRAM device includes a magnetoresistive tunnel junction (MTJ).

20. The IC structure of claim 19, wherein the MTJ includes a pair of electrodes having a tunnel barrier material therebetween, and the first material is on an electrode of the pair of electrodes.

21. The IC structure of claim 18, wherein the second material includes oxygen and nitrogen.

22. The IC structure of claim 18, wherein the electrical contact further includes a third material, wherein the second material is between the first material and the third material, and the third material includes titanium.

23. The IC structure of claim 22, wherein the third material is between the second material and the metal contact.

24. The IC structure of claim 18, wherein the second material is a passivation material.

25. The IC structure of claim 18, wherein the first material includes tantalum.

* * * * *

UNITED STATES PATENT AND TRADEMARK OFFICE
CERTIFICATE OF CORRECTION

| | | |
|---|---|---|
| PATENT NO. | : 10,411,068 B2 | Page 1 of 1 |
| APPLICATION NO. | : 15/767127 | |
| DATED | : September 10, 2019 | |
| INVENTOR(S) | : Christopher J. Wiegand et al. | |

It is certified that error appears in the above-identified patent and that said Letters Patent is hereby corrected as shown below:

In the Claims

In Column 20, Line 56, in Claim 12, delete "(M RAM)" and insert -- (MRAM) --, therefor.

Signed and Sealed this
Twenty-ninth Day of October, 2019

Andrei Iancu
*Director of the United States Patent and Trademark Office*